(12) United States Patent
Bulteel et al.

(10) Patent No.: US 10,027,910 B2
(45) Date of Patent: Jul. 17, 2018

(54) METHOD FOR AVOIDING PIXEL SATURATION

(71) Applicant: SOFTKINETIC SENSORS NV, Brussels (BE)

(72) Inventors: Olivier Bulteel, Oslo (NO); Thomas Finateu, Brussels (BE); Ward Van Der Tempel, Keerbergen (BE)

(73) Assignee: SoftKinetic Sensors NV, Brussels (BE)

( * ) Notice: Subject to any disclaimer, the term of this patent is extended or adjusted under 35 U.S.C. 154(b) by 0 days.

(21) Appl. No.: 14/898,951

(22) PCT Filed: Oct. 10, 2014

(86) PCT No.: PCT/EP2014/071799
§ 371 (c)(1),
(2) Date: Dec. 16, 2015

(87) PCT Pub. No.: WO2015/071034
PCT Pub. Date: May 21, 2015

(65) Prior Publication Data
US 2016/0330391 A1    Nov. 10, 2016

(30) Foreign Application Priority Data

Nov. 15, 2013 (EP) .................................. 13193068

(51) Int. Cl.
*H04N 5/359* (2011.01)
*H04N 5/355* (2011.01)
(Continued)

(52) U.S. Cl.
CPC .......... *H04N 5/3594* (2013.01); *H04N 5/355* (2013.01); *H04N 5/35536* (2013.01);
(Continued)

(58) Field of Classification Search
CPC .. H04N 5/3594; H04N 5/355; H04N 5/35536; H04N 5/35572; H04N 5/37457;
(Continued)

(56) References Cited

U.S. PATENT DOCUMENTS 6,002,123 A * 12/1999 Suzuki ............... H04N 5/35527
250/208.1
6,088,058 A * 7/2000 Mead .................... H04N 5/353
257/291

(Continued)

FOREIGN PATENT DOCUMENTS

EP          2 477 393 A1   7/2012
JP          2012-151847     8/2012
(Continued)

OTHER PUBLICATIONS

Korean Communication and English translation thereof for Korean Application No. 10-2016-7000040 dated Dec. 12, 2016.
(Continued)

*Primary Examiner* — Michael Osinski
(74) *Attorney, Agent, or Firm* — Wolf, Greenfield & Sacks, P.C.

(57) ABSTRACT

The invention relates to a method for avoiding pixel saturation in a group of pixels, each having a node, wherein a reference voltage is predetermined, and wherein a voltage change at the node of only one of the pixels compared to the predetermined reference voltage causes the synchronous reset of all pixels of the group.

17 Claims, 14 Drawing Sheets

(51) Int. Cl.
*H04N 5/3745* (2011.01)
*H01L 27/146* (2006.01)

(52) U.S. Cl.
CPC ..... *H04N 5/35572* (2013.01); *H04N 5/37457* (2013.01); *H01L 27/14654* (2013.01)

(58) Field of Classification Search
CPC ...... H04N 5/353; H04N 5/3535; H04N 5/374; H04N 5/3559; H04N 5/3745; H04N 5/235; H04N 5/35581; H04N 5/372; H04N 5/3741; H04N 5/2353; H04N 5/3592; H04N 5/2351; H04N 5/3591; H01L 27/14609; H01L 27/14665; H01L 27/14603; H01L 27/14612; H01L 27/14636; H01L 27/14654
See application file for complete search history.

(56) References Cited

U.S. PATENT DOCUMENTS

| | | | |
|---|---|---|---|
| 6,529,241 B1 | 3/2003 | Clark | |
| 6,831,689 B2 * | 12/2004 | Yadid-Pecht | H04N 5/3535 348/222.1 |
| 6,927,796 B2 * | 8/2005 | Liu | H04N 3/155 348/294 |
| 6,963,370 B2 * | 11/2005 | DiCarlo | H04N 5/35545 348/297 |
| 6,977,685 B1 | 12/2005 | Acosta-Serafini | |
| 7,038,820 B1 * | 5/2006 | Kindt | H04N 5/2351 348/297 |
| 7,569,868 B2 * | 8/2009 | Watanabe | H04N 3/155 257/184 |
| 7,593,048 B2 * | 9/2009 | Clark | H01L 27/14609 348/297 |
| 7,791,657 B2 * | 9/2010 | Joshi | H04N 5/3532 348/222.1 |
| 7,830,439 B2 * | 11/2010 | Kishi | H04N 3/1512 348/302 |
| 7,920,193 B2 * | 4/2011 | Ladd | H04N 5/235 348/308 |
| 7,965,328 B2 * | 6/2011 | Wakamori | H04N 5/3532 348/308 |
| 7,990,451 B2 * | 8/2011 | Belenky | H04N 3/155 250/208.1 |
| 8,068,155 B2 * | 11/2011 | Muroshima | H04N 5/3598 348/294 |
| 8,106,981 B2 * | 1/2012 | Song | H04N 3/155 348/297 |
| 8,625,012 B2 * | 1/2014 | Yuan | H04N 5/35527 250/208.1 |
| 9,137,465 B2 * | 9/2015 | Nakajima | H04N 5/367 |
| 9,245,920 B2 * | 1/2016 | Ahn | H01L 27/14665 |
| 9,363,455 B2 * | 6/2016 | Takeda | H04N 5/374 |
| 9,497,396 B2 * | 11/2016 | Choi, II | H01L 27/14609 |
| 9,521,340 B2 * | 12/2016 | Nakajima | H04N 5/367 |
| 2002/0027606 A1 * | 3/2002 | Yadid-Pecht | H04N 5/3535 348/298 |
| 2003/0112351 A1 * | 6/2003 | Clark | H01L 27/14609 348/307 |
| 2006/0027730 A1 | 2/2006 | Bamji et al. | |
| 2006/0181628 A1 * | 8/2006 | Kishi | H04N 3/1512 348/308 |
| 2008/0218614 A1 * | 9/2008 | Joshi | H04N 5/3532 348/262 |
| 2008/0239126 A1 * | 10/2008 | Wakamori | H04N 5/3532 348/308 |
| 2008/0297609 A1 * | 12/2008 | Song | H04N 3/155 348/207.99 |
| 2009/0101796 A1 * | 4/2009 | Ladd | H04N 5/235 250/206 |
| 2010/0026838 A1 | 2/2010 | Belenky et al. | |
| 2010/0039543 A1 * | 2/2010 | Muroshima | H04N 5/3598 348/300 |
| 2011/0141325 A1 * | 6/2011 | Nakajima | H04N 5/367 348/246 |
| 2012/0068051 A1 * | 3/2012 | Ahn | H01L 27/14603 250/208.1 |
| 2013/0075593 A1 * | 3/2013 | Williams, Jr. | H01L 27/14636 250/208.1 |
| 2013/0119233 A1 | 5/2013 | Guezzi et al. | |
| 2013/0248685 A1 * | 9/2013 | Ahn | H01L 27/14665 250/208.1 |
| 2014/0211052 A1 * | 7/2014 | Choi, II | H01L 27/14609 348/297 |
| 2016/0005785 A1 * | 1/2016 | Barbier | H04N 5/3594 250/208.1 |

FOREIGN PATENT DOCUMENTS

WO  WO 2008/062404 A2  5/2008
WO     2010084493       7/2010

OTHER PUBLICATIONS

Chinese Office Action for Chinese Application No. 2014800389802 dated Jan. 17, 2018.

* cited by examiner

| Green | Blue |
|---|---|
| Red | Green |

Figure 17

| Green | Blue |
|---|---|
| Red | Saturation Detector |

METHOD FOR AVOIDING PIXEL SATURATION

CROSS-REFERENCE TO RELATED APPLICATIONS

This application is a § 371 national stage entry of International Application No. PCT/EP2014/071799, filed Oct. 10, 2014, which claims priority to European Patent Application No. 13193068.7 filed Nov. 15, 2013, the entire contents of which are incorporated herein by reference.

TECHNICAL FIELD OF THE INVENTION

The present invention relates to the field of High Dynamic Range CMOS pixels and the associated sensors. In particular, the present invention relates to improvements in, or relating to, the robustness of pixels against incident light by detecting and avoiding pixel saturation. By robustness, it is meant the capability of the pixels to achieve their function of light quantification.

BACKGROUND OF THE INVENTION

An image sensor is a device capturing and converting an impinging electromagnetic radiation such as a light flux into an electronic signal. In digital imaging, Active-Pixel Sensors (APS) are mostly used. APS are image sensors consisting of an integrated circuit containing an array of pixel sensors, and wherein each pixel contains a photodiode and an active amplifier. There are many types of Active-Pixel Sensors, including the Complementary Metal Oxide Semiconductor (CMOS) APS, used most commonly in cell phone cameras or web cameras for instance. Such image sensors have emerged as an alternative to Charge-Coupled Device (CCD) image sensors.

In an APS, the photodiode is sensitive to incident light. More precisely, the photodiode converts the incident light into charges which are accumulated during a given exposure time and then converted into an amplified voltage inside the pixel. This voltage is a continuous analog physical quantity which can be converted, thanks to an analog-to-digital converter, to a digital number representing the voltage amplitude. The terminals of the cathode of the photodiode, referred to as the node attached to the cathode, is often called the detector node. This node (20) is displayed in FIG. 1 illustrating an APS pixel. The voltage at this node is translated towards the pixel output via a transistor used as an amplifier. One important figure of merit characterizing pixels is their so-called fill factor. It refers to the portion of area sensitive to the light, in percentage, among the entire pixel area. FIG. 2 discloses a typical pixel area, divided in a photosensitive area 1 and a circuitry area 2.

One of the major disadvantages of standard pixels is their potential saturation appearing when too strong incident light and/or too long exposure occur. In range imaging system using Time of Flight technologies (ToF), for example a Time-of-flight camera system providing distance information by analysing the Time of Flight and the phase of a pulsed light signal emitted by a controlled light source and reflected back by objects from the scene, the saturation may occur when objects having standard reflective properties are closer from the distance range the imaging system is calibrated for. The object reflects at that time too much from the emitted light and causes at least some pixels of the sensor to respond at their maximum value. The saturation may also occur when objects demonstrates specular reflective properties in the wavelength domain the pixels have been designed to be sensitive to, such as when a mirror in a scene reflects the entire incident light it receives onto the sensor imaging the scene, or when objects reflect and concentrate the incident light onto a portion of the sensor, or when an external light source emitting a strong illumination in the same wavelength domain the ToF camera has been designed for is illuminating the sensor. When pixels are saturated, meaningful information about the scene is lost since the response provided is flattened at the maximum voltage value that can be provided; this leads to image artefacts or defects such as burned area, blooming effects in images. Moreover, certain applications, for instance the computation of depth information in ToF technology, use phase shift based computations from a plurality of captures to derive a distance measurement. If pixel saturation occurs during integration time, the voltage at the detector nodes reaches a saturation level which corrupts the corresponding capture. This more particularly makes relative voltage amplitudes determination in between the different phase impossible and as a consequence, the depth measurements and the corresponding depth map cannot be determined anymore as it is usually derived directly from these phase difference computations.

For the purpose of overcoming saturation issues, amongst other things, High Dynamic Range (HDR) or Wide Dynamic range (WDR) have been proposed in standard image sensors using several electronic circuits, for instance Schmitt trigger (as defined herein below) with addition of latches and/or memory point. Sensors have also been designed with technics such as well adjusting, multiple captures or spatially varying exposure. Moreover, extra logic circuitry has been added per CMOS APS, but this reduces the effective sensitive area of sensor and results in a very low fill factor that do not comply with efficient ToF imaging requirements. Another solution consists in using circuits with logarithmic pixels. Such pixel circuits generate a voltage level that is a logarithmic function of the amount of light striking a pixel. This is different from most CMOS or CCD type image sensors that use a linear type of pixels. Nevertheless, the use of logarithmic pixels complicates highly the post processing to compute required data, as depth information for instance, since it introduces well known compression issues and request also extra processing computations.

SUMMARY OF THE INVENTION

The object of the invention is to improve the robustness of pixels against incident light by avoiding their saturation. To this end, the invention first relates to a method according to claim 1.

The invention is moreover particularly adapted to the context of Time-of-Flight imaging where active Infra-red modulated light illumination is driven at high frequencies and where the illumination signal to be measured may suffer from the coexisting ambient light in the scene, or from varying reflectivities and distances of objects in the scene.

It is therefore an advantage that, due to the use of the synchronous reset pixel, saturation is avoided in the group of pixels, which avoid image artefacts.

It is a further advantage that by avoiding pixel saturation during integration time, the present invention avoids the neighbouring pixels of a pixel that would have demonstrated saturation without reset to be corrupted by migrating charges and the associated blooming defect artefact.

Moreover, by avoiding pixel saturation, the present invention enables further preventing the sensor suffering from blooming effects and the associated image artefacts.

It is a further advantage that, due to the sharing of the saturation circuitry among several pixels, the fill factor is kept high, and the additional circuitry is limited.

It is a further advantage that, due to the use of the synchronous reset pixel, the information carried by the voltage amplitudes at the pixel detector nodes are not corrupted by saturation, which enables to compute relative amplitudes and/or phase differences in between nodes. As a consequence in the TOF imaging context, the data measurement are preserved and enable the determining of distance information.

Advantageously, the reset of all pixels is authorized at least once within a given integration time $T_{INT}$ by an enable signal which can be a pulse, a clock, or a pulse wave with tunable period and/or duty cycle.

Preferably, absolute High Dynamic Range measurements can be estimated. From the number of synchronous reset which may have been triggered during each integration time, or from the time at which the last synchronous reset has been triggered combined with the unsaturated detector node voltage from the individual pixel nodes, the total absolute voltages corresponding to incident light received during the entire integration time can be estimated.

The invention also relates to a synchronous reset pixel device according to claim 6 and an imager according to claim 7.

Other advantages and novel features of the invention will become more apparent from the following detailed description when taken in conjunction with the accompanying drawings.

BRIEF DESCRIPTION OF THE DRAWINGS

The present invention shall be better understood in light of the following description and the accompanying drawings.

FIG. 17 depicts a standard Bayer matrix with 2 green pixels, one blue pixel and one red pixel;

FIG. 18 depicts the same matrix than in FIG. 17, but with one green pixel being replaced by a synchronous reset pixel acting as a saturation detector;

FIG. 19 illustrates a depth pixel matrix with one synchronous reset pixel per group of 9 pixels and FIG. 20 illustrates a depth sensing pixel matrix with one synchronous reset pixel per group of 5 pixels.

DESCRIPTION OF THE INVENTION

The present invention relates to a synchronous reset pixel which can be classified as a High Dynamic Range pixel system and the associated method. The pixel may comprise at least one photodiode, each photodiode having its own detector node. The present invention is capable of resetting a group of local pixels, that is emptying the detector nodes of the pixels from the charges accumulated during an exposure. The reset may be triggered when one of the voltages corresponding to those charges reaches a predetermined threshold voltage value. This avoids the detector nodes to reach a saturation level before or at end of the integration time. The principle relies on a comparator based logic circuitry that detects at least once the reach of the predetermined threshold voltage, during a given integration time. The logic is shared by a group of pixel in order to minimize the silicon area involved in the comparison task and to keep the fill factor high so as to preserve the sensing task efficiency. The logic enables a plurality of resets during the given integration time as the comparison task may be executed several times with respect to a specifically predetermined series of occurrences (e.g. Tint/2, 3Tint/4, 7Tint/8 . . . ). When at least one of the pixels reaches the "saturation indicating voltage", which is given by the aforementioned predetermined threshold voltage, the logic may decide to reset or not the group of pixels at the same time. In the context of TOF imaging wherein a plurality of unsaturated amplitude measurements must necessarily be collected for computing reliable phase differences and depth estimations, the system and method of the present invention is particularly well suited as it enables the providing of reliable information such as impinging signal phases and impinging signal relative values.

In the latest, the impinging signal absolute value may further be estimated as the invention may comprises an additional "reset counting circuitry" and a method for determining the total amplitude of signal collected during integration time using this reset counter.

For purpose of clarity, the present description will be described with respect to the computation of depth in 3D image sensors in Time-Of-Flight (ToF) measurements, but the invention is not limited thereto, as we will see later below. The invention could be useful for any type of sensors where the saturation of pixels has to be avoided.

The introduced embodiments will be described according to the use of a Schmitt trigger as the comparator means 12, but the invention is not limited thereto. The comparator 12 can for instance be made by a continuous time comparator or a clocked comparator, a CMOS inverter or any kind of circuitry capable of generating a pulsed signal from the output of the lowest voltage detector block 11, such as a monostable.

Figure 1:
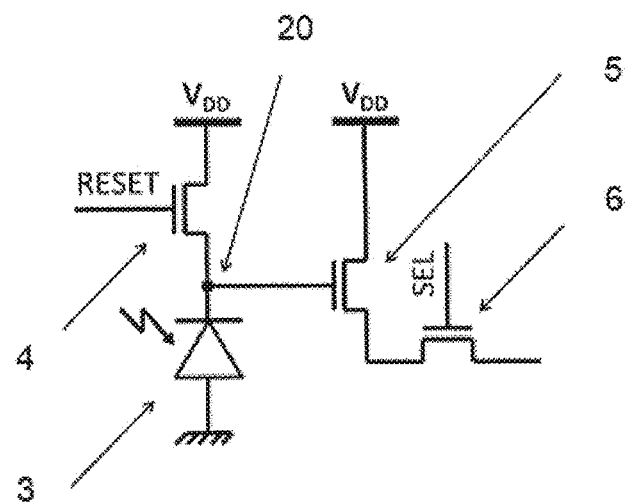
FIG. 1 depicts a standard 3-Transistors Active Pixel Sensor composed of a photodiode 3, a reset transistor 4, a transistor used as an amplifier 5 and a pixel selection transistor 6.
Figure 3:
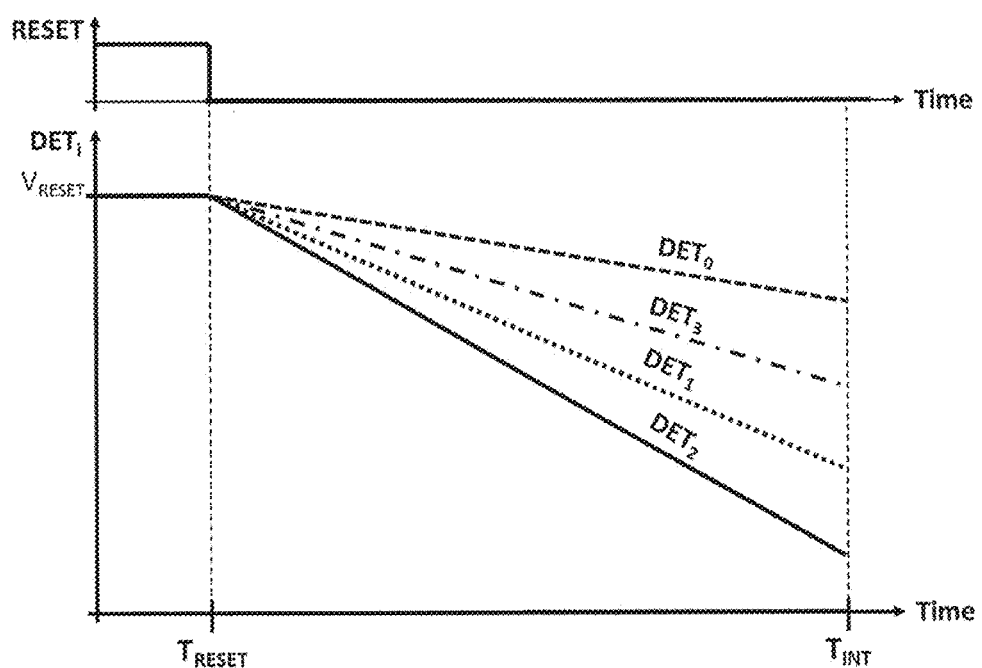
FIG. 3 illustrates a typical voltage drop, at the nodes of a group of 4 pixels, without incident light.
Figure 4:
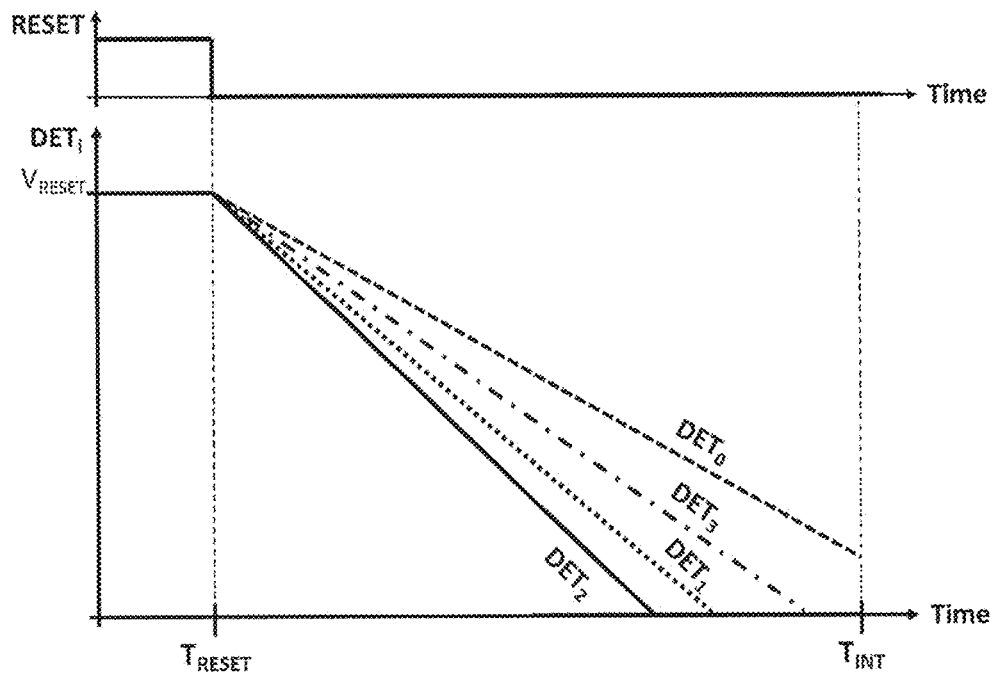
FIG. 4 illustrates a voltage drop example at the nodes of the same pixels introduced in FIG. 3, under a strong incident light.

Moreover, for addressing the synchronous reset comparison function, a lowest voltage detector block may be used for searching for the lowest voltage as in a three Transistor (3T) APS, FIG. 1. In that case, the detector voltages are going down from $V_{RESET}$ towards ground as shown in FIG. 3 and FIG. 4. Obviously, we could have referred to a highest voltage detector block in the case wherein the detector voltages would have been going up from $V_{RESET}$ to supply.

Time-Of-Flight camera systems are known for providing information concerning the distance to an object by analysis of the time-of-flight from a light source to the object and back. In those systems, a scene is illuminated with a modulated light, usually a pulse. This signal is then reflected back from objects and collected by a lens to form an image. Depending on the distance of objects from the camera, a delay appears between the emission of the modulated light and the reception of its reflection at the camera. This delay, or phase, which may be derived over the time and/or over successive pulses, are used for determining a direct measure of an object's distance in the scene. It is therefore mandatory to have reliable unsaturated signal measurement data coming from the sensor.

FIG. 3 illustrates an example of detector node (cathode of the photodiode) waveforms versus time in TOF imager, without incident light. Before the beginning of the integration or expose time $T_{INT}$, the RESET signal is kept high in order to reset all the detector nodes to the initial and suitable voltage conditions. When, the RESET signal is released, integration time starts. At the end of integration or exposure time $T_{INT}$, none of the detectors are saturated and the depth information can be computed.

On the contrary, FIG. 4 illustrates the same setup as FIG. 3, but submitted to a strong incident light. The voltage at the nodes of detectors $DET_2$, $DET_1$ and $DET_3$ drops too rapidly before the end of the integration time $T_{INT}$. Those 3 detector nodes are saturated, the absolute values collected at end of the integration time of the corresponding pixels are corrupted and meaningless. By corrupted, it is meant that the determined voltage values are not reliable since not representing a real absolute measurement representative of the input light signal. As a consequence, relative amplitudes of pixels are also corrupted and the associated phase information as well, making depth information impossible to be computed anymore.

FIG. 1 illustrates a standard CMOS 3-Transistors Active Pixel Sensor (CMOS 3-T APS), consisting of a photodiode 3, a RESET transistor 4, a source-follower readout transistor 5 and a SELECTION transistor 6. When the RESET transistor 4 is turned on, the photodiode 3 is directly connected to the power supply $V_{DD}$, and all integrated charges are cleared. The source-follower readout transistor 5 acts as an amplifier which allows the pixel voltage to be observed without removing the accumulated charge. The SELECTION transistor 6 allows a single row of the pixel array to be read-out by the read-out electronics. In order to achieve a high fill factor, the area sensitive to light of the photodiode 3 should be high, whereas the area of circuitry, consisting of the area of transistors 4, 5 and 6, should be as reduced as possible.

Figure 5:
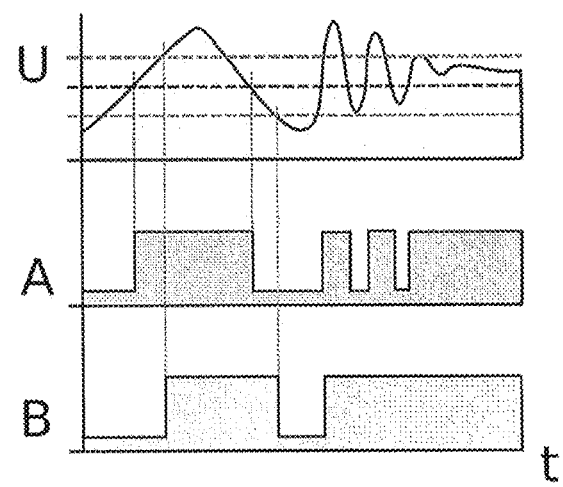
FIG. 5 compares the effects of a standard comparator (A) with those of a Schmitt trigger (B), on an input signal (U)

For understanding purposes, a particular electronic circuit used in further embodiments of this present invention has to be introduced: the Schmitt trigger. In the non-inverting configuration, a Schmitt trigger is a circuit with positive feedback and a loop gain greater than 1. It can be assimilated as a comparator circuit with hysteresis. FIG. 5 compares the effects of standard comparator (A) and Schmitt trigger (B) on a given input signal (U). Using non-inverting Schmitt trigger, when the input is higher than a certain chosen threshold, the output is high. When the input is below a different (lower) chosen threshold, the output is low, and when the input is between the two levels, the output retains its value. This dual threshold action is called hysteresis and implies that the Schmitt trigger possesses memory and can act as a bistable circuit.

By comparison, a standard comparator has only one threshold value, and its output is switched by comparison to this value, as represented FIG. 5 (A).

Figure 6:
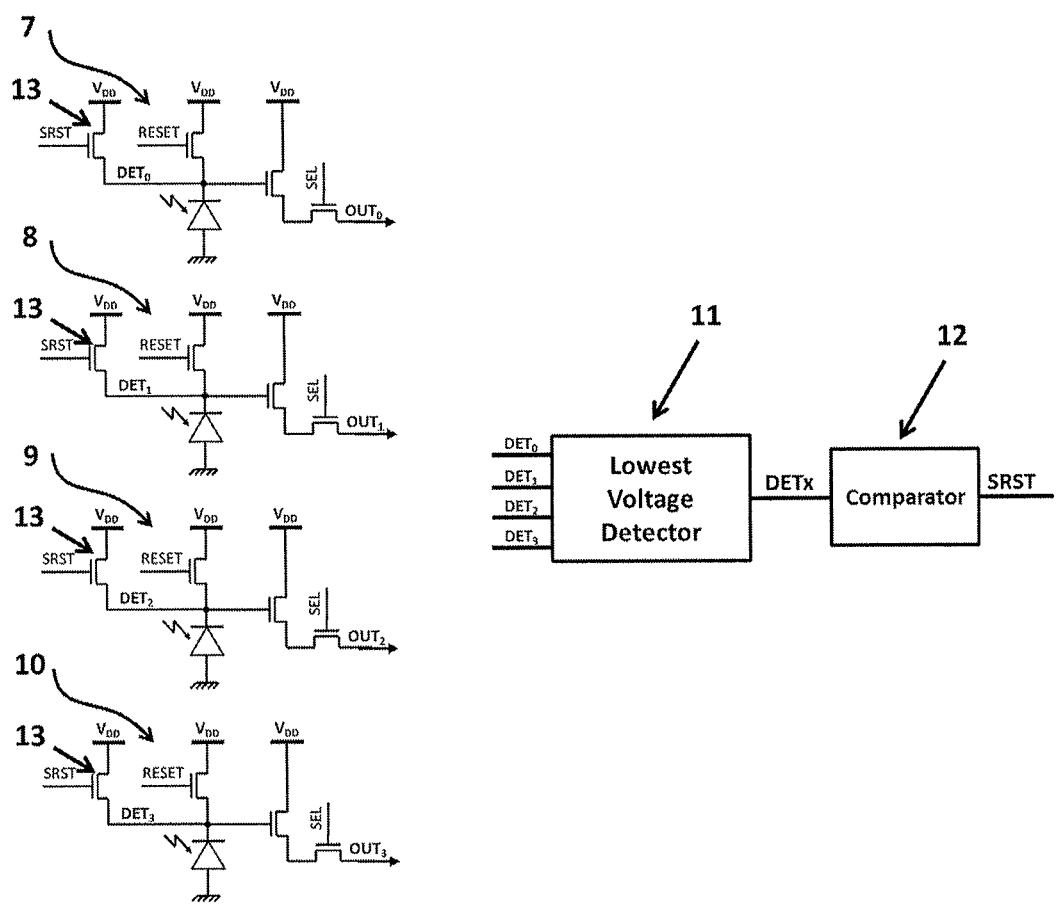
FIG. 6 illustrates a block diagram of a synchronous reset pixel composed of 4 Three-Transistors Active Pixel Sensors (7, 8, 9, 10), a lowest detector block 11, a comparator 12 and 1 extra transistor 13 added to each 3-T APS.

FIG. 6 illustrates a first embodiment of the present invention with a synchronous reset pixel dealing with 4 pixels having each at least one detector node. It is made of 4 CMOS 3-T APS 7, 8, 9, 10, a lowest voltage detector block 11 having 4 inputs, a comparator 12 and 1 extra transistor 13 added to each 3-T APS (so in total 4 extra transistors). The photodiodes of the 3-T APS do not necessarily have to be identical. The lowest voltage detector 11 inputs sense the detector nodes of the 4 APS: $DET_0$, $DET_1$, $DET_2$, and $DET_3$. Here, the comparator 12 can be made by either a comparator comparing $DET_X$ with a reference voltage $V_{REF}$ or a Schmitt trigger having its lower detection threshold equal to $V_{REF}$, or any kind of circuitry capable of generating a pulsed signal from the output of the lowest voltage detector block, such as a monostable. The reset functionality of transistors 13 can be achieved by a dedicated logic circuitry and the re-use of the RESET transistors of the 3T APS.

Figure 7:
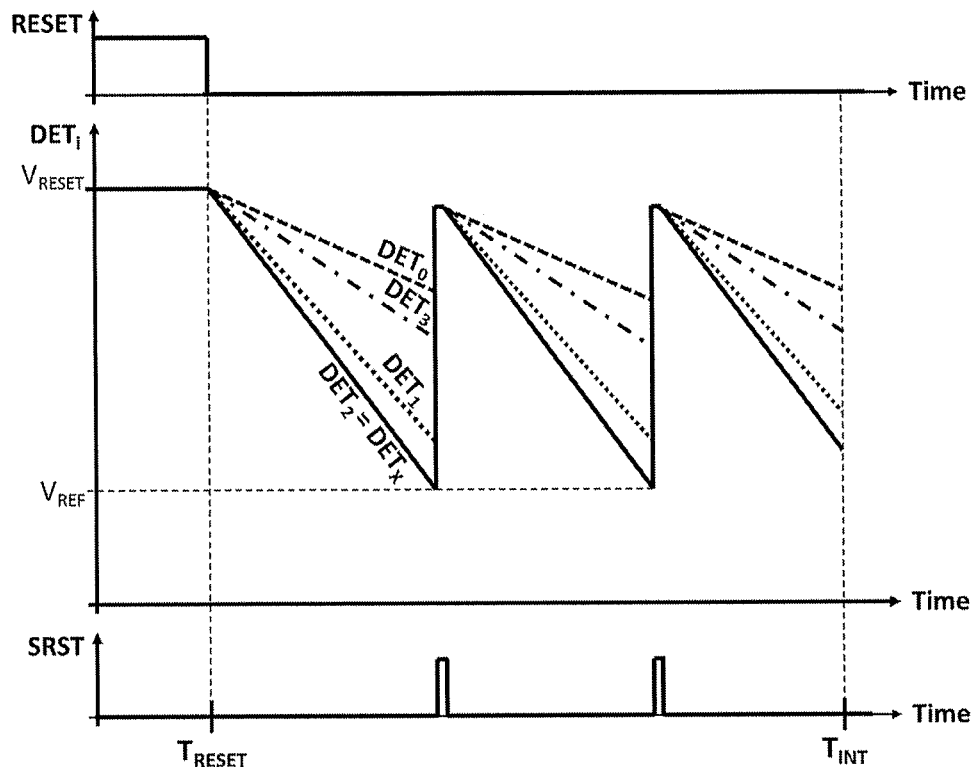
FIG. 7 depicts the timing diagram of the synchronous reset pixel with a comparator, as exposed previously in FIG. 6.

FIG. 7 depicts the timing diagram of the synchronous reset pixel presented in FIG. 6. Thanks to the added lowest voltage detector 11 and comparator 12, the pixels are not saturated anymore after an integration time $T_{INT}$. Indeed, as soon as one of the pixel voltages reach $V_{REF}$ voltage, SRST signal goes high and reset all pixels. Hence, pixel saturation is avoided.

Figure 8:
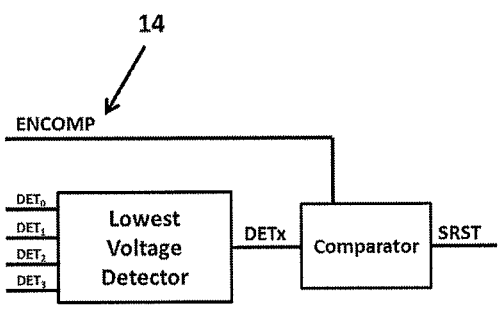
FIG. 8 illustrates a block diagram of the same synchronous reset pixel as in FIG. 6, but with the addition of an ENCOMP pin 14 connected to the comparator.
Figure 9:
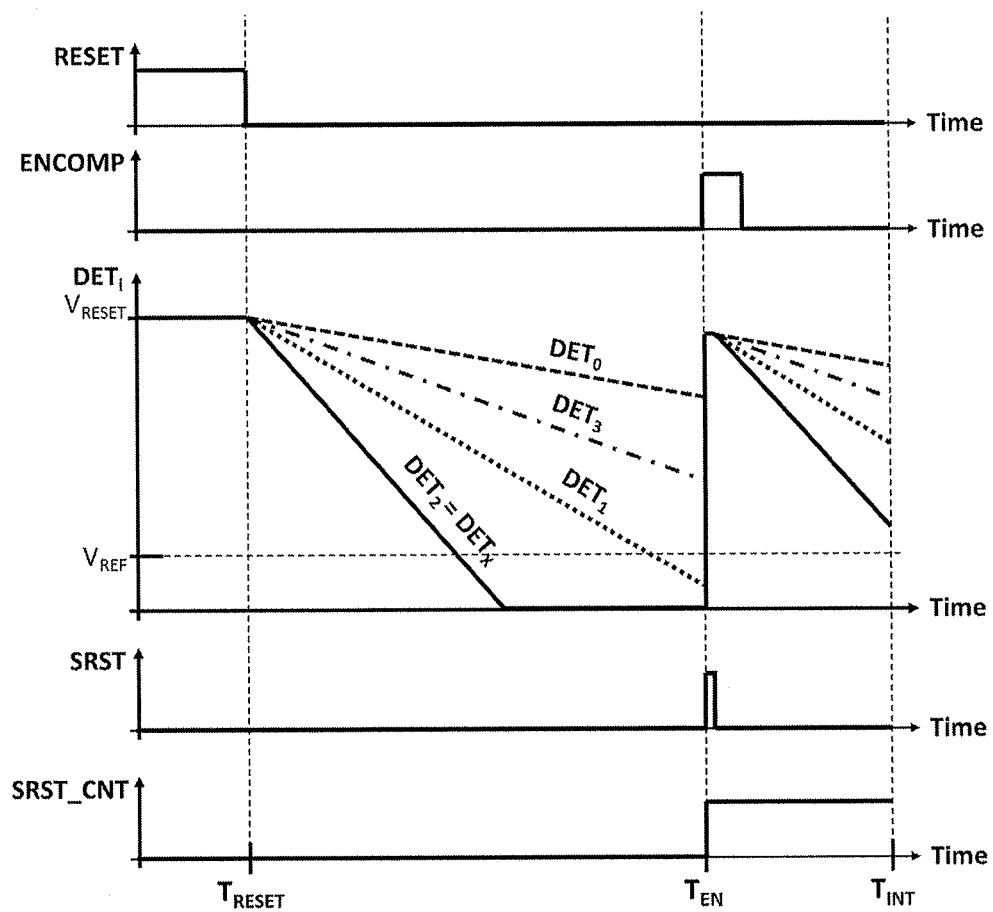
FIG. 9 displays the timing diagram referring to the synchronous reset pixel represented FIG. 8, with an effective integration time of $T_{INT}$-$T_{EN}$.

FIG. 8 illustrates a second embodiment of the present invention, a block diagram of the synchronous reset pixel but with the addition of an ENCOMP pin 14 connected to the comparator 12. This ENCOMP pin 14 is added to define a shorter integration time ($T_{INT}$-$T_{EN}$). Indeed, detectors which have crossed the reference signal before ENCOMP pulse will restart their integration cycle but with a shorter time so that saturation until the end of exposure time $T_{INT}$ is impossible for these pixels. $T_{EN}$ is programmable and must be set to avoid pixel saturation. High level of the ENCOMP signal can be rather short and should be long enough to completely reset the pixels. FIG. 9 displays the timing diagram of the synchronous reset pixel as shown in FIG. 8, including lowest voltage detector 11 and comparator 12 plus its ENCOMP pin 14. Comparator 12 can only toggle its output if ENCOMP signal is set high. When ENCOMP signal is low, the pixels can saturate as if there would be no extra circuitry.

Figure 10:
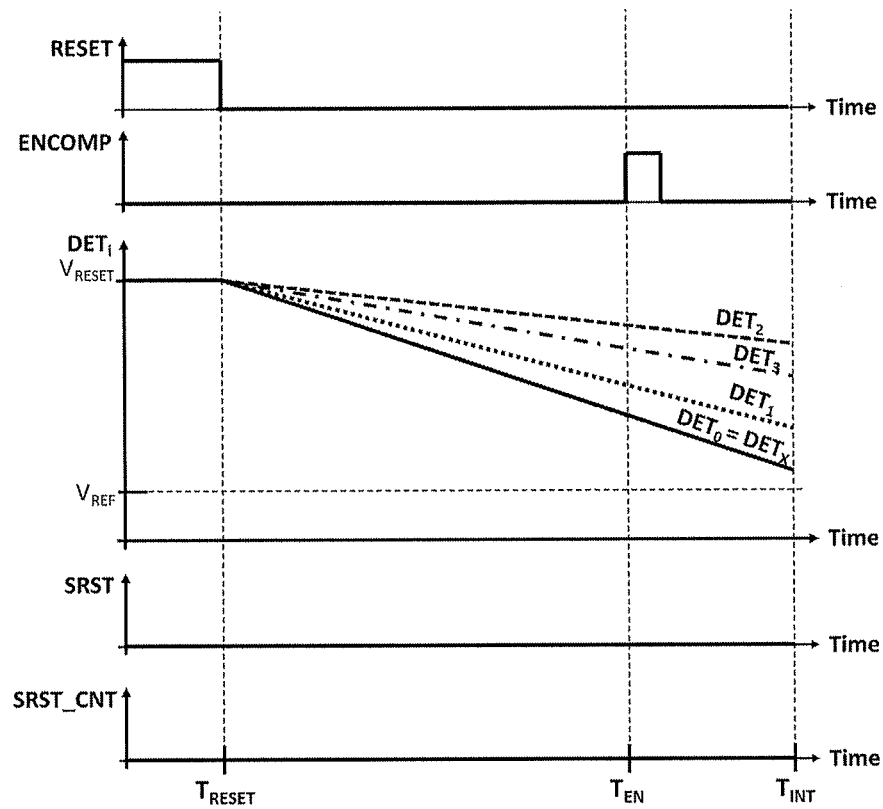
FIG. 10 displays the timing diagram referring to the synchronous reset pixel represented FIG. 8, with an integration time of $T_{INT}$.

On top of that, a SRST_CNT signal is added and is set high as soon as there is a pulse on SRST signal. Thanks to ENCOMP and SRST_CNT signals, the integration time can easily be computed. At the end of the exposure, the integration time is either ($T_{INT}$-$T_{EN}$) if FLAG signal is high or $T_{INT}$ if FLAG signal is low. FIG. 9 and FIG. 10 illustrates both cases.

The SRST CNT signal can be considered as a 1-bit counter.

Instead of a basic 1-bit counter, the saturation detector circuitry could embed a n-bit counter and deliver the information as an output. Using such a counter, the absolute value is known per detectors (pixels) on top of the relative values of each one.

In this embodiment, by using a comparator or an inverter instead of a Schmitt trigger, the high level duration of ENCOMP pin can be chosen in such a way that the reset level can be identical to the initial one. Schmitt trigger threshold limitations, such as not being able to reach $V_{RESET}$ during synchronous reset, are overcome.

Figure 11:
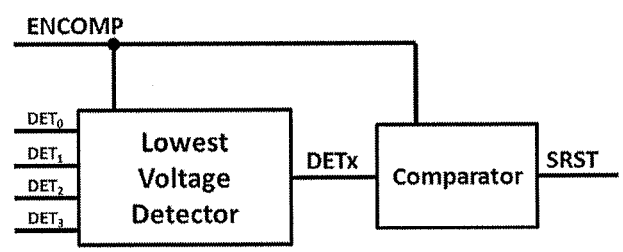
FIG. 11 illustrates a block diagram of the same synchronous reset pixel as in FIG. 6, but with the addition of an ENCOMP pin 14 connected to both the comparator and the lowest voltage detector.

A third embodiment is presented FIG. 11. FIG. 11 shows a block diagram of the synchronous reset pixel but with the addition of an ENCOMP pin 14 connected to both the lowest voltage detector 11 and the comparator 12.

Figure 12:
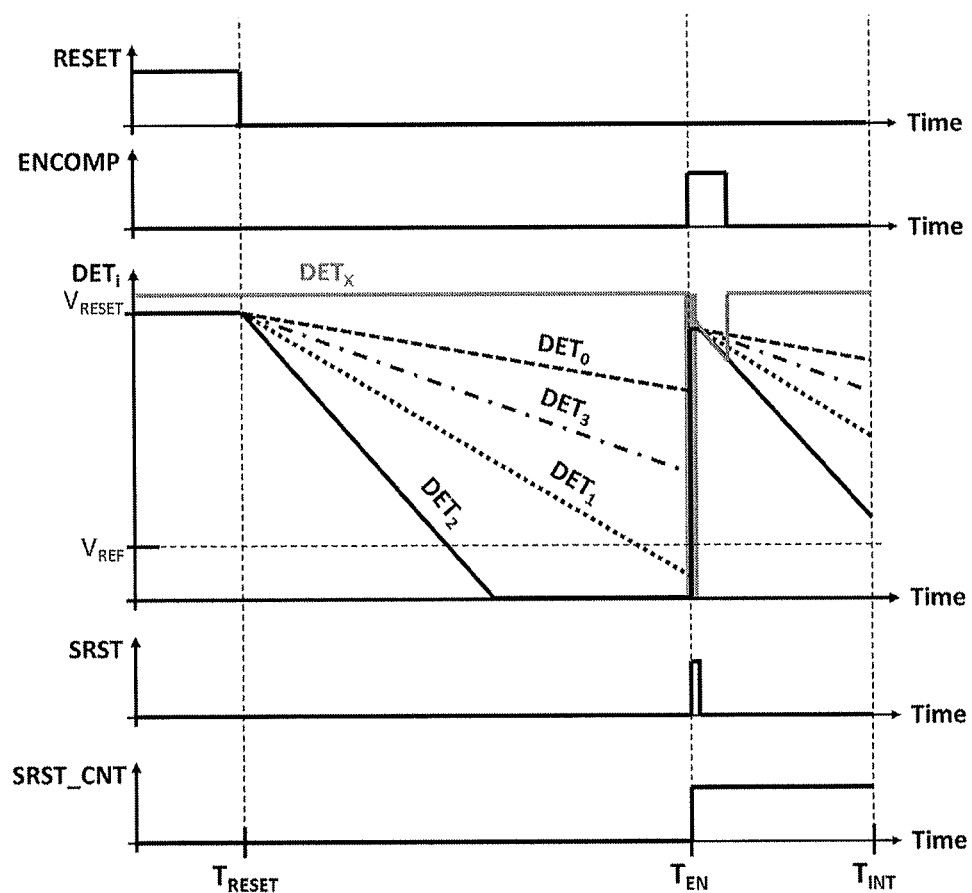
FIG. 12 displays the timing diagram referring to the synchronous reset pixel represented FIG. 11, with an effective integration time of $T_{INT}$-$T_{EN}$.

FIG. 12 shows the same input conditions than FIG. 9. The only change resides in the ENCOMP pin 14, connected to both lowest voltage detector 11 and comparator 12. $DET_X$ copies the lowest voltage among $DET_0$, $DET_1$, $DET_2$, and $DET_3$ only when ENCOMP signal is high. The outcome for SRST and SRST_CNT signals is identical for both configurations.

Those second and third embodiments have the benefit of saving current as lowest voltage detection and comparison are only made when ENCOMP signal is set high. Indeed, the comparator 12 works as an analog "voltage comparator", and its current consumption will be linked to its input voltage. With the addition of the ENCOMP pin 14, the comparator 12 and occasionally the lowest voltage detector 11 will only consume current a fraction of the time compared to the case without ENCOMP pin 14, as ENCOMP signal is disabled most of the time.

Figure 13:
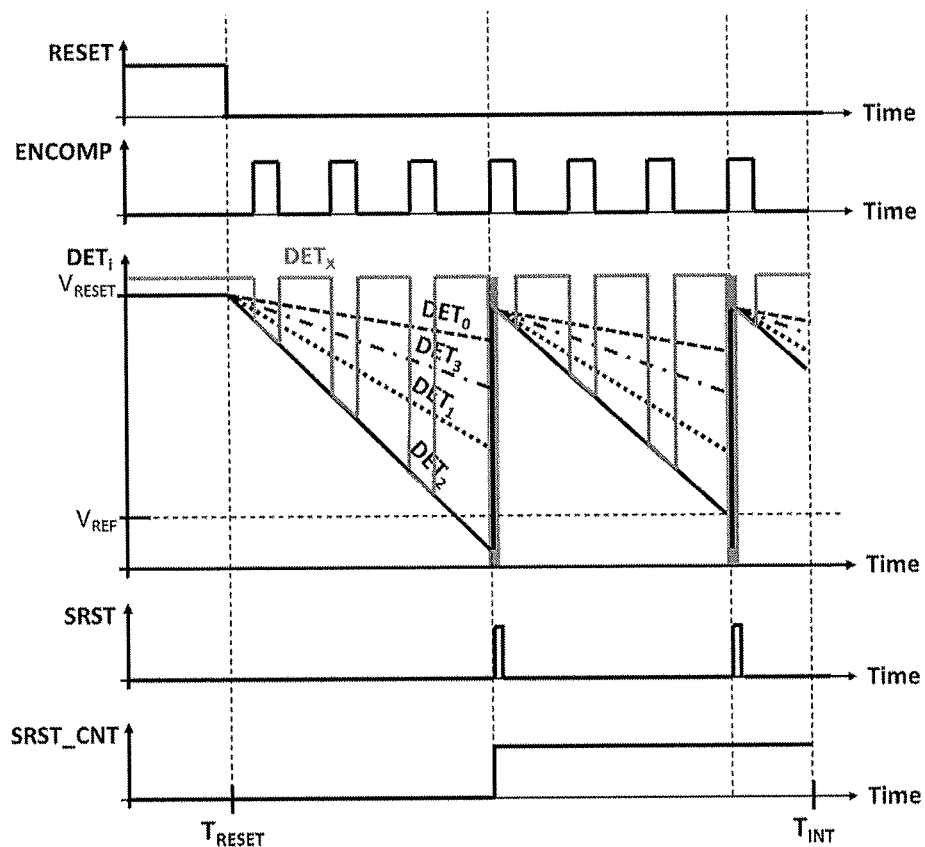
FIG. 13 illustrates the timing diagram of the synchronous reset pixel represented in FIG. 11, but with the substitution of the pulse of the ENCOMP pin 14 with a clock, in which 2 saturations occur.

A fourth embodiment is presented FIG. 13, where ENCOMP signal is replaced by a clock signal instead of a single pulse. The clock can be considered as a pulse train and consequently the comparison process happens more often. This embodiment is interesting for applications requiring only relative voltage differences between pixel detector nodes and not voltage amplitude. Such an application could be the depth computing for instance, as described herein above.

In FIG. 13, two saturations occur and the SRST_CNT signal was raised as soon as the first SRST pulse appear. In this example, a 1-bit counter is not enough as there was 2 SRST pulses. However, the integration of a 2-bit counter would have be enough to retrieve the correct number of SRST events. Relative voltages between DET nodes are correct but absolute amplitudes aren't without the help of the 2-bit counter. In the context of ToF, the given relative measurements are suitable enough to estimates par pixel depth values.

Figure 14:
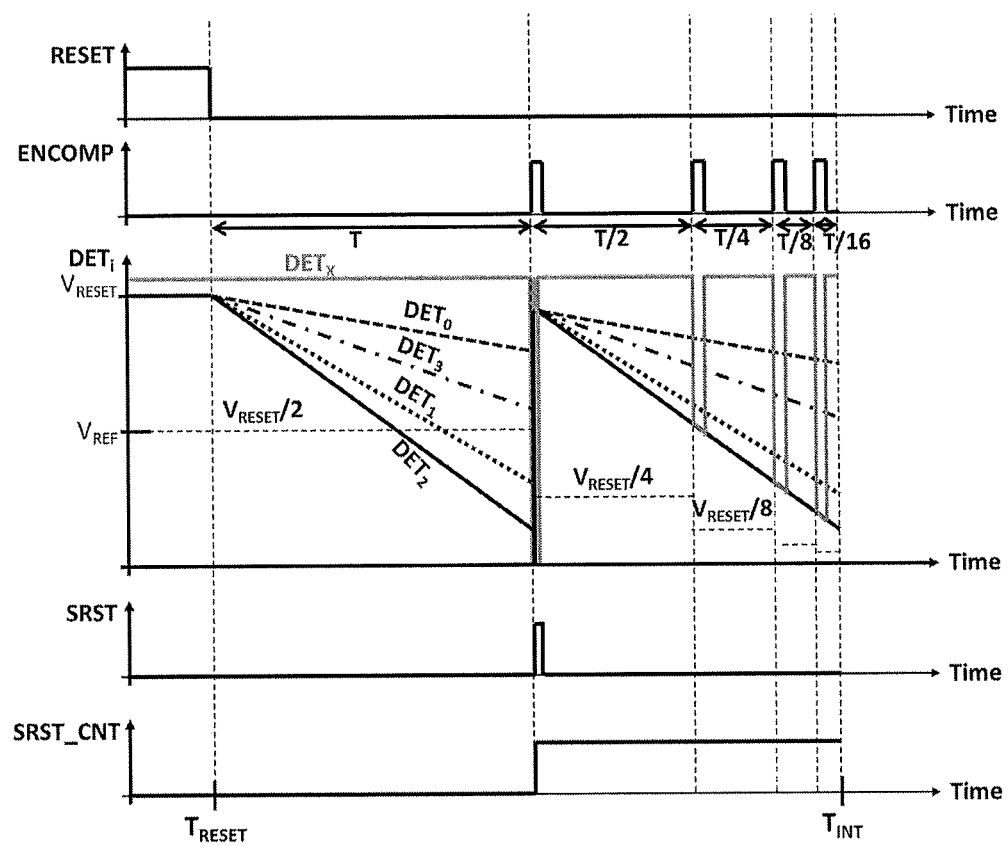
FIG. 14 illustrates the timing diagram of the synchronous reset pixel represented in FIG. 11, but with the substitution of the pulse of the ENCOMP pin 14 with a clock, with tunable reference voltage and tunable clock period.

A fifth embodiment is depicted FIG. 14 which depicts an example of optimised timing diagrams obtained with the proposed synchronous reset pixel of FIG. 13. One would notice that 2 parameters (ENCOMP signal period and $V_{REF}$ reference voltage) are being changed during integration time. ENCOMP period varies from T to T/16, with T the reference period which could be equal to half of $T_{INT}$, and $V_{REF}$ reference voltage varies from $V_{RESET/2}$ to $V_{RESET/32}$ in scale of 2. The purpose of these variations is to optimize the signal amplitudes at the end of the integration time. Those variations are optimized and based on the fact that the voltage drops at the nodes of pixels are linear. The minimum generated ENCOMP period and reference voltage could be lower than T/16 and would even ideally tend towards 0. This statement is also valid for reference voltage $V_{REF}$. The ENCOMP period and reference voltage values are chosen to be simple and are given as indication for clarity but obviously some other configurations (adding a constant offset, adding a gain to each values) can be found which will lead to the same functionality.

Figure 15:
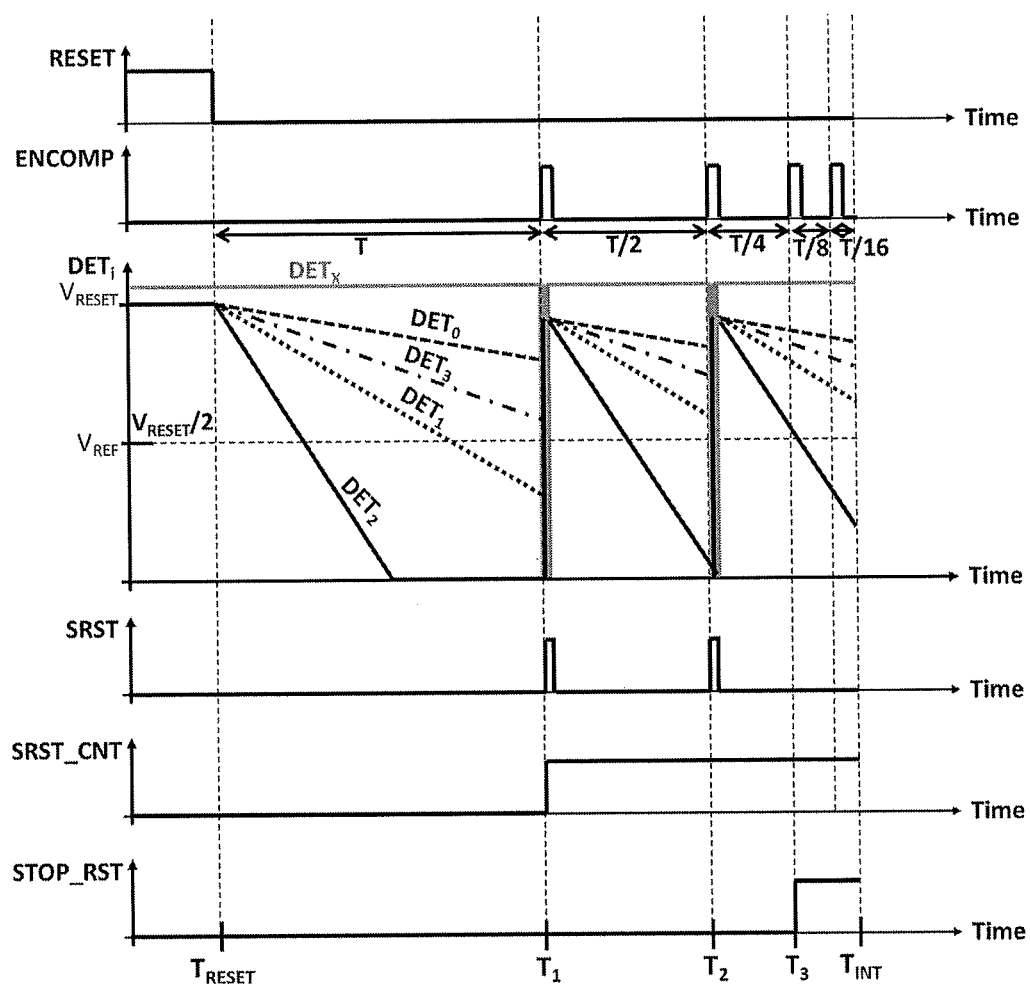
FIG. 15 illustrates the timing diagram of a synchronous reset pixel, in which a STOP_SRST signal is used in order to forbid SRST.

A sixth embodiment is depicted in FIG. 15. In this embodiment, the reference voltage does not vary anymore and is kept constant at $V_{RESET/2}$. The ENCOMP signal period is still varying. SRST signal still allows reset of all detector nodes when it is high. However, there is now the addition of a signal STOP_SRST which forbids the SRST signal only when STOP_SRST signal is high. When ENCOMP signal is high, STOP_SRST signal can either be set low if the node $DET_X$ is lower than the reference voltage $V_{REF}$ or be set high if the node $DET_X$ is higher than the reference voltage $V_{REF}$. For instance, in FIG. 15, at the beginning, STOP_SRST is set low thanks to the RESET signal. Then, at time T1, the first pulse of ENCOMP signal happens, $DET_X$ is lower than $V_{REF}$, hence STOP_SRST is kept low, SRST is allowed to trigger the reset. At time T2, same conditions are met than at time T1, hence SRST signal makes a pulse. However, at time T3, $DET_X$ is higher than $V_{REF}$, as a result, STOP_SRST signal is set high which forbids SRST pulse. Once STOP_SRST signal is turned high, it remains high until the end on the integration time $T_{INT}$. The detectors will not reach saturation assuming incident light is constant during the whole integration time Tint.

Other configurations of clock period and voltage reference can lead to similar results than the one described above. In practice, margins may have to be used for determining the reference voltage. For instance, initial $V_{REF}$ may become $V_{RESET/2}+/-V_{OFFSET}$.

Figure 16:
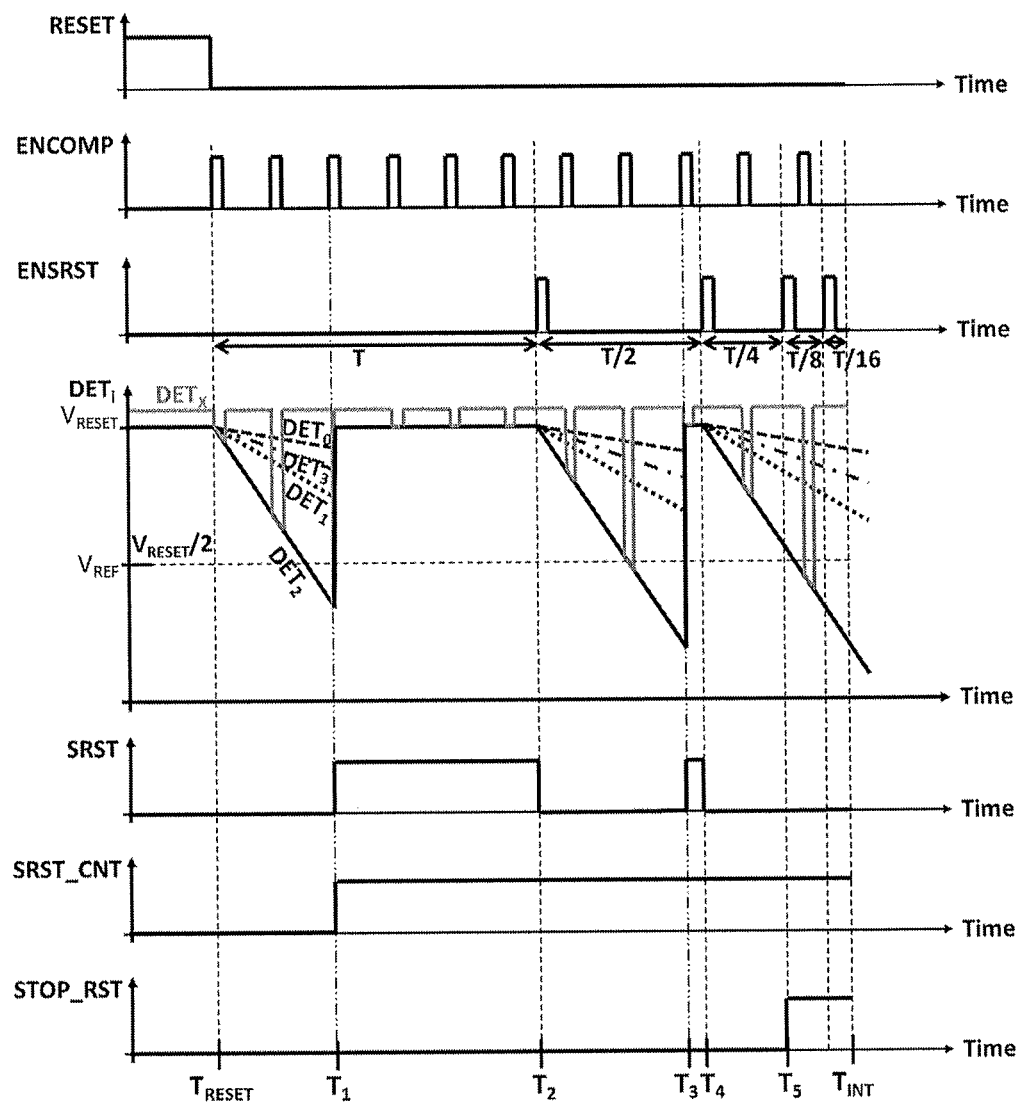
FIG. 16 illustrates the timing diagram of the synchronous reset pixel represented in FIG. 11, but with the substitution of the pulse of the ENCOMP pin 14 with a constant clock, and an ENSRST signal with tunable clock period.

A seventh embodiment is introduced in FIG. 16. It has the benefit of preventing any of the nodes to reach saturation compared to FIG. 15. Doing so, any kind of blooming effect is avoided. Blooming may be induced when at least one of the detector nodes saturates, meaning its associated pixel well capacity is reached and that any extra photons could make charges migrate into the neighbouring pixel's well. In this embodiment, a not varying reference voltage is used and kept constant at $V_{RESET/2}$. The ENCOMP signal is now used as a clock with a constant period. There is another signal called ENSRST which is a signal with period changing from T to T/16 in scale of 2, with T the reference period which could be equal to half of $T_{INT}$.

When ENCOMP signal is high and STOP_SRST signal is low, the lowest voltage detector is enabled and $DET_X$ recopies the lowest voltage among the detector nodes. When ENCOMP signal is high and STOP_SRST signal is low, if $DET_X$ signal is lower than reference voltage $V_{REF}$, hence SRST signal is set high which allows reset of all detector nodes. On the other hand, when ENCOMP signal is high and STOP_SRST signal is low, if $DET_X$ signal is higher than reference voltage $V_{REF}$, hence SRST signal is set low. Once SRST signal is set high, it will remain high until a pulse on ENSRST signal is received. If STOP_SRST is high, the lowest voltage detector is not enabled, hence DETx does not recopy the lowest voltage among the detector nodes. STOP_SRST is set low at the beginning of the integration time. It is set high whenever SRST is low when a pulse on ENSRST happens. Once it is set high, it remains high until the end of the integration time. This means that the detector nodes will not be saturated at the end of the integration time.

For instance, in FIG. 16, at time T1, SRST is set high as $DET_X$ is lower than reference signal $V_{REF}$. Consequently, DET nodes are being reset which avoids any detector node to saturate and potentially fill its pixel well, hence avoiding blooming. SRST will remain high until receiving an ENSRST pulse which happens at time T2. At time T2, another integration phase happens and as SRST is high, STOP_SRST remains low. Then, another saturation is detected at time T3 and SRST is one more time set high. SRST will be released by ENSRST pulse at time T4 and integration phase starts again and STOP_SRST remains still low. At time T5, ENSRST does not have to release SRST as no saturation was detected between times T4 and T5. Hence, STOP_SRST is set high as SRST is low. As a result, integration will continue until the end of the integration time $T_{INT}$.

Other configurations of clock period and voltage reference can lead to similar results than the one here described herein above. In practice, margins may have to be taken for the reference voltage. For instance, initial $V_{REF}$ may become $V_{RESET/2}+V_{OFFSET}$.

In a further preferred embodiment, the system and method described herein above may be implemented in a HDR context. Indeed, in HDR, measuring or estimating the real absolute value of the incident light at the node level is required.

The method and device described herein above enable to obtain a valid, meaningful, reliable voltage amplitude corresponding to the measured light at the end of the integration time. By associating a counter to the logic to keep track of the number of resets done during that integration time, it may be possible to measure or obtain the absolute voltage amplitude suitable for HDR implementation.

Considering the linearity of the voltage drop at the node and considering the incident light power as a constant over the time, the absolute high dynamic range measurement may corresponds to:

the sum of the final voltage amplitude measurement at the node to which is added the voltage amplitude value corresponding to the difference between the reference voltage and synchronous reset voltage times the number of synchronous reset or An extrapolation of the final voltage amplitude measurement obtained for the last integration time (=well-known fraction of the integration time), knowing the number of synchronous reset counted.

For clarity purpose, the present description has been described above with respect to the computation of depth in 3D image sensor in Time-Of-Flight (TOF) measurement, but the invention is not limited thereto.

Out of the TOF imagers, the synchronous reset pixel, presented above, could be applied to conventional imagers. For instance, FIG. 17 and FIG. 18 show how the proposed innovation could be applied to a colour pixel matrix such as the standard Bayer matrix (FIG. 17) or Foveon based color sensing architecture, or any other light capturing sensing system. Indeed, for instance, in a standard bayer matrix based color sensor, the usual second green pixel could be replaced by a synchronous reset pixel in charge of detecting saturation of the remaining color pixel: blue, green and red, as illustrated FIG. 18. In order to give more strength to the green pixel and compensate for the loss of the second green pixel, some imager process techniques could be applied such as light pipes, quantum dot films or micro-lenses for instance.

In "depth" imagers, the proposed synchronous reset pixel system and method could be used as illustrated in FIG. 19 and FIG. 20, depicting two possible organizations of pixels. It further could be extended to a in-pixel architecture embodiment wherein each pixel could comprise a plurality of detector nodes and a synchronous reset circuitry for comparing voltages at those nodes in order to reset at least the nodes of each individual pixel if saturation is detected at those detector nodes. Optionally, the neighbouring pixels of the above mentioned embodiment could also be reset so as to preserve the system suffering from potential blooming effect. The proposed synchronous reset pixel takes care to either monitor adjacent incident lights or monitor its own incident for the whole group. For the first case, if one of these adjacent pixels saturates, then the whole group is reset at the same time. For the second case, if the central pixel saturates, then the whole group is reset at the same time. In FIG. 19, one synchronous reset pixel (SAT DET) is placed per group of 9 pixels whereas, in FIG. 20, one synchronous reset pixel (SAT DET) is placed per group of 5 pixels.

Figure 2:
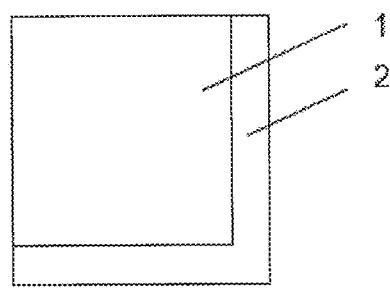
FIG. 2 illustrates a typical pixel area, divided in photosensitive 1 and circuitry areas 2
Figure 21:
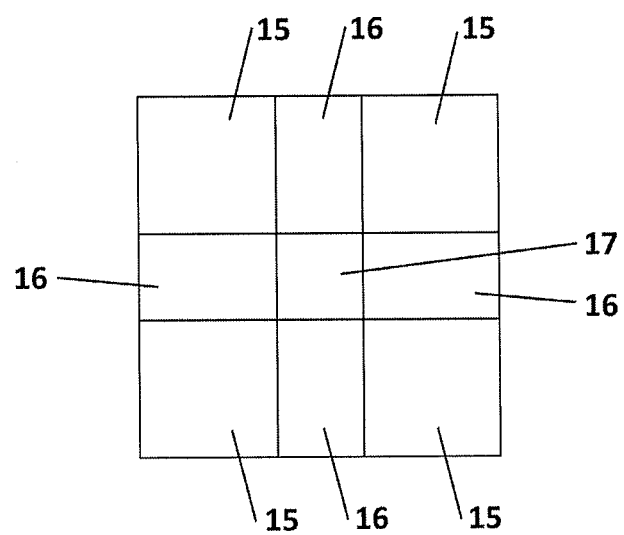
FIG. 21 illustrates a depth sensing pixel matrix with one synchronous reset logic shared over a group of 4 pixels. The area is divided in photosensitive area 15, the associated pixel circuitry area 16, and the share synchronous reset logic 17.

Moreover, the synchronous reset logic does not necessarily have to be embedded in a dummy pixel. It could be part of the circuitry area 2 of FIG. 2. Indeed, synchronous reset logic can also be integrated within the circuitry area as depicted in FIG. 21. FIG. 21 shows a specific configuration, but obviously there are much more configurations possible.

The invention claimed is:

1. A method for avoiding pixel saturation in a group of pixels during an integration time period $T_{INT}$, wherein each of the pixels in the group of pixels has a detector and a detector node, the method comprising:
   comparing a voltage at the detector node of each pixel in the group of pixels with a reference voltage during the integration time period;
   causing a synchronous reset of the detectors of all pixels in the group of pixels when the voltage at the detector node of only one of the pixels in the group of pixels is equal to the reference voltage; and
   sequentially decreasing the reference voltage at each synchronous reset of the detectors of all the pixels in the group of pixels during the integration time period.

2. The method according to claim 1, wherein the reset of the detectors of all pixels in the group of pixels is authorized during the integration time $T_{INT}$, by at least one authorization signal.

3. The method according to claim 2, wherein the authorization signal is an enable signal (ENCOMP) for authorizing the reset of the detectors of all pixels in the group of pixels just once.

4. The method according to claim 2, wherein the authorization signal is a pixel clock signal for authorizing the reset of the detectors of all pixels in the group of pixels at least once.

5. The method according to claim 4, wherein the pixel clock signal has a period which varies during the integration time $T_{INT}$.

6. The method according to claim 5, wherein the variable period of said pixel clock signal is consecutively decreased by a predetermined factor to form a series of occurrences at which the reset of the detectors of all pixels in the group of pixels is enabled when voltage at detector nodes reaches the predetermined reference voltage.

7. The method according to claim 6, wherein the predetermined factor is 2.

8. The method according to claim 1, wherein the reference voltage is sequentially decreased during the integration time period by a constant factor.

9. The method according to claim 1, wherein the constant factor is 2.

10. The method according to claim 1, wherein a signal reset counter signal (SRST_CNT) is set to high if at least one saturation occurs.

11. The method according to claim 10, wherein the SRST_CNT signal is an n-bit signal which counts the number of occurring saturations.

12. The method according to claim 1, wherein the said group of pixels includes at least two pixels.

13. The method according to claim 10, wherein absolute High Dynamic Range measurements are estimated on the basis of i) the voltage at the detector nodes of the pixels at the end of the integration time and ii) the number of occurring saturations counted.

14. The method according to claim 1, further comprising:
estimating absolute High Dynamic Range measurements on the basis of a voltage at the detector nodes of the pixels at an end of the integration time period and an occurrence in time at which a last synchronous reset has occurred during the integration time period.

15. A synchronous reset pixel device for the implementation of the method recited in claim 1, comprising:
a group of pixels, each of which comprises a detector which is sensitive to light, connected to a detector node, a RESET transistor, a source-follower readout transistor and a SELECTION transistor;
at least one voltage detector, configured to sense a voltage change at the detector nodes of each of the pixels in the group of pixels and output a saturated pixel; and
comparator circuitry configured to compare said reference voltage with the voltage sensed at the detector node of each of said pixels in the group of pixels.

16. An imager comprising:
the synchronous reset pixel device according to claim 15 and
a matrix of pixels connected to said device.

17. The imager according to claim 16, further comprising Time-Of-Flight measurement circuitry.

* * * * *